(12) United States Patent  
Fujino

(10) Patent No.: US 6,674,685 B2
(45) Date of Patent: Jan. 6, 2004

(54) SEMICONDUCTOR MEMORY DEVICE HAVING WRITE COLUMN SELECT GATE

(75) Inventor: Takeshi Fujino, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/222,840

(22) Filed: Aug. 19, 2002

(65) Prior Publication Data

US 2003/0123317 A1 Jul. 3, 2003

(30) Foreign Application Priority Data

Dec. 27, 2001 (JP) ........................................ 2001-397190

(51) Int. Cl.[7] .............................. G11C 8/00; G11C 7/00
(52) U.S. Cl. ............................ 365/230.06; 365/230.03; 365/189.04
(58) Field of Search ...................... 365/189.01, 189.04, 365/196, 203, 207, 230.03, 230.06

(56) References Cited

U.S. PATENT DOCUMENTS 6,278,653 B1 * 8/2001 Hardee ........................ 365/233
6,330,202 B1   12/2001 Tanizaki et al.
6,339,541 B1 * 1/2002 Hardee et al. ................ 365/63

FOREIGN PATENT DOCUMENTS

| JP | 8-111093 | 4/1996 |
| JP | 8-147975 | 6/1996 |

OTHER PUBLICATIONS

Y. Agata, et al, "An 8ns Random Cycle Embedded RAM Macro With Dual–Port Interleaved DRAM Architecture ($D^2RAM$)" Digest of Technical Papers of 2000 IEEE International Solid–State Circuits Conference, Feb. 9, 2000, pp. 392–393.

* cited by examiner

Primary Examiner—Thong Quoc Le
(74) Attorney, Agent, or Firm—McDermott, Will & Emery

(57) ABSTRACT

A DRAM includes a sense amplifier which is activated when first and second nodes are set respectively to L and H levels to amplify a potential difference between paired bit lines. The DRAM further includes a write column select gate which is activated when the first node is set to L level to write a data signal on a pair of write data lines into a corresponding sense amplifier when a corresponding write column select line is set to H level. In this way, the data signal can be written into the sense amplifier simultaneously with sensing and amplification of memory cell data, which can enhance the random access rate.

10 Claims, 11 Drawing Sheets

SEMICONDUCTOR MEMORY DEVICE HAVING WRITE COLUMN SELECT GATE

BACKGROUND OF THE INVENTION

1. Field of the Invention

The present invention relates to semiconductor memory devices and, particularly to a semiconductor memory device allowing a data signal to be rewritten thereinto.

2. Description of the Background Art

FIG. 10 is a circuit block diagram showing a principal portion of a conventional dynamic random access memory (hereinafter DRAM). Referring to FIG. 10, the DRAM includes a plurality of memory cells MC arranged in rows and columns, a word line WL provided correspondingly to each row, a pair of bit lines BL and /BL provided correspondingly to each column, and a pair of write data lines WDL and /WDL. The DRAM further includes a write column select gate 50, a sense amplifier 55 and an equalizer 60 that are provided correspondingly to each column.

Write column select gate 50 includes N-channel MOS transistors 51–54. N-channel MOS transistors 51 and 52 are connected in series between bit line BL and write data line WDL, and N-channel MOS transistors 53 and 54 are connected in series between bit line /BL and write data line /WDL. N-channel MOS transistors 51 and 53 have respective gates connected to a write column select line WCSL and N-channel MOS transistors 52 and 54 have respective gates receiving signal WDE. Signal WDE is set to L level (logical low level) for write masking and set to H level (logical high level) in normal operation. When signal WDE has H level and write column select line WCSL designated according to column address signal CA is set to H level which is the selection level, N-channel MOS transistors 51–54 of the corresponding column are turned on to couple paired bit lines BL and /BL and paired write data lines WDL and /WDL.

Sense amplifier 55 includes N-channel MOS transistors 56 and 57 and P-channel MOS transistors 58 and 59. N-channel MOS transistors 56 and 57 are connected respectively between bit lines BL and /BL and a node N51, and have respective gates connected respectively to bit lines /BL and BL. P-channel MOS transistors 58 and 59 are connected respectively between bit lines BL and/BL and a node N52, and have respective gates connected respectively to bit lines /BL and BL. Nodes N51 and N52 receive sense amplifier activation signals SNL and SPL respectively. In a standby state, sense amplifier activation signals SNL and SPL are each set to potential VCC/2, i.e., a half of a power supply potential VCC. In an active state, sense amplifier activation signals SNL and SPL are set respectively to L and H levels. Sense amplifier activation signals SNL and SPL are set to L and H levels respectively to activate sense amplifier 55 which in turn amplifies a minute or considerably small potential difference between corresponding paired bit lines BL and /BL up to power supply potential VCC.

Equalizer 60 is activated when bit line equalize signal BLEQ is set to the activation level, L level, and accordingly precharges corresponding paired bit lines BL and /BL to bit line precharge potential VBL (=VCC/2).

FIG. 11 is a timing chart illustrating a write operation of the DRAM shown in FIG. 10. In a standby state, word line WL is set to the non-selection level, L level, to inactivate memory cell MC. Write column select line WCSL is also set to the non-selection level, L level, to make write column select gate 50 nonconductive. Equalizer 60 is activated to precharge paired bit lines BL and /BL to precharge potential VCC/2. Sense amplifier activation signals SPL and SNL are set to the immediate level VCC/2 to inactivate sense amplifier 55. Here, signal WDE is set to H level.

First, active command ACT and row address signal RA are provided, equalizer 60 is inactivated, and word line WL of a row according to row address signal RA is raised to the selection level, H level. Word line WL is thus set to H level to activate each memory cell MC corresponding to that word line WL. Then, a minute potential difference of a polarity according to data stored in memory cell MC is generated between paired bit lines BL and /BL. Then, sense amplifier activation signals SPL and SNL are set to H and L levels respectively to activate sense amplifier 55. Accordingly, the potential difference between paired bit lines BL and /BL is amplified to power supply potential VCC.

Second, write command WRT and column address signal CA are provided. Write column select line WCSL of a column according to column address signal CA is raised to the selection level, H level, to make write column select gate 50 of that column conductive. Accordingly, paired bit lines BL and /BL of that column and paired write data lines WDL and /WDL are coupled. In advance, write data lines WDL and /WDL are set respectively at L and H levels for example according to a write data signal. Then, the levels of respective bit lines BL and /BL of the selected column are converted to the levels of respective write data lines WDL and /WDL. The levels of bit lines BL and /BL of any non-selected column are maintained. After a predetermined time has passed, write column select line WCSL is lowered to the non-selection level, L level.

Third, precharge command PRE is provided. Word line WL is lowered to the non-selection level, L level, to inactivate memory cell MC. Sense amplifier activation signals SPL and SNL are set to the intermediate level, VCC/2, to inactivate sense amplifier 55. Equalizer 60 is activated and paired bit lines BL and /BL are set to bit line precharge potential VBL. In this way, the data signal is written.

FIG. 12 is a circuit block diagram showing a principal portion of another conventional DRAM. Referring to FIG. 12, this DRAM differs from the DRAM in FIG. 10 in that the former includes a write column select gate 61 instead of write column select gate 50. Write column select gate 61 includes N-channel MOS transistors 62–65. N-channel MOS transistors 62 and 63 are connected in series between bit line BL and a line of a ground potential GND. N-channel MOS transistors 64 and 65 are connected in series between bit line /BL and the line of ground potential GND. N-channel MOS transistors 62 and 64 have respective gates both connected to write column select line WCSL, and N-channel MOS transistors 63 and 65 have respective gates connected respectively to write data lines /WDL and WDL.

When write column select line WCSL is raised to the selection level, H level, N-channel MOS transistors 62 and 64 are turned on. When write data lines WDL and /WDL have H and L levels respectively, N-channel MOS transistor 65 is turned on while N-channel MOS transistor 63 is turned off. Then, bit line /BL is lowered to L level, and sense amplifier 55 raises bit line BL to H level. When write data lines WDL and /WDL have L and H levels respectively, N-channel MOS transistor 63 is turned on while N-channel MOS transistor 65 is turned off. Then, bit line BL is lowered to L level and sense amplifier 55 raises bit line /BL to H level. Except for the above-described details, the DRAM shown in FIG. 12 has the same structure and operation as those of the DRAM shown in FIG. 10 and description thereof is not repeated here.

High-speed writing into conventional DRAMs is possible in a page mode, in which column selection is performed multiple times successively for one activated memory-cell row, since it is merely necessary that write command WRT is input multiple times after active command ACT is applied once. However, in a random access mode in which row address signal RA and column address signal CA are changed each time write operation is carried out, the three steps shown in FIG. 11 are required for each write operation, which makes it difficult to speed up the write operation.

Specifically, random access of at least 50 MHz is possible to a static random access memory (hereinafter SRAM) while random access of as low as approximately 22 MHz is merely possible to a DRAM. This results in an obstacle for the DRAM to achieve functions of the SRAM implemented in a system LSI.

SUMMARY OF THE INVENTION

One object of the present invention is thus to provide a semiconductor memory device to which enhanced-speed random access is possible.

A semiconductor memory device according to the present invention includes: a memory block including a plurality of memory cells, a plurality of word lines, and a plurality of pairs of bit lines; a sense amplifier provided correspondingly to each pair of bit lines and activated in response to application of a first drive potential to a first node to amplify a potential difference generated between the bit lines of the corresponding bit line pair; a row decoder selecting one of the word lines according to a row address signal to activate each memory cell corresponding to the selected word line; a column decoder selecting one of the pairs of bit lines according to a column address signal; a pair of write data lines provided commonly to the pairs of bit lines; a write circuit, according to a write data signal, setting one of first and second write data lines included in the pair of write data lines to a first potential and setting the other of the first and second write data lines to a second potential; and a write column select gate transmitting, in write operation, the data signal on the pair of write data lines to the pair of bit lines selected by the column decoder. The write column select gate includes first and second transistors provided correspondingly to each pair of bit lines, having respective gate electrodes connected to the first and second write data lines respectively and having respective first electrodes both connected to the first node, and third and fourth transistors provided correspondingly to each pair of bit lines, having respective first electrodes connected to respective second electrodes of the first and second transistors and having respective second electrodes connected respectively to first and second bit lines of the corresponding pair of bit lines, the third and fourth transistors being rendered conductive, in the write operation, in response to selection of the corresponding pair of bit lines by the column decoder. Thus, even if the column decoder and the write circuit are activated prior to activation of the sense amplifier, the sense amplifier never operates unless a drive potential is applied to a predetermined node. The column decoder and the write circuit are then activated prior to activation of the sense amplifier so as to allow a data signal to be written into the sense amplifier simultaneously with sensing and amplification of memory cell data, which enhances the random access rate.

Preferably, the first and second transistors are provided commonly to the pairs of bit lines. The required number of the first and second transistors is thus reduced and the load capacitance of the write circuit accordingly decreases, which provides speedup of write operation.

Still preferably, the semiconductor memory device further includes a write control circuit activating, in response to a write command signal, the row decoder, the column decoder and the write circuit and thereafter applying the first drive potential to the first node to activate the sense amplifier. The write command can thus be issued simply since only one write command signal may be provided.

Still preferably, the semiconductor memory device further includes a precharge circuit provided correspondingly to each pair of bit lines for precharging the corresponding pair of bit lines to a predetermined potential. The write control circuit inactivates, after the write operation is completed, the row decoder, the column decoder, the write circuit and the sense amplifier, and activates the precharge circuit. Only one write command signal is necessary for the process up to precharging and thus the operation of issuing write command is further simplified.

Still preferably, the sense amplifier includes fifth and sixth transistors of N-channel type, connected respectively between the first and second bit lines and the first node, and having respective gate electrodes connected respectively to the second and first bit lines, and seventh and eighth transistors of P-channel type connected respectively between the first and second bit lines and a second node and having respective gate electrodes connected respectively to the second and first bit lines. The sense amplifier is activated in response to application of the first drive potential to the first node and application of the second drive potential to the second node. Then, the sense amplifier can readily be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
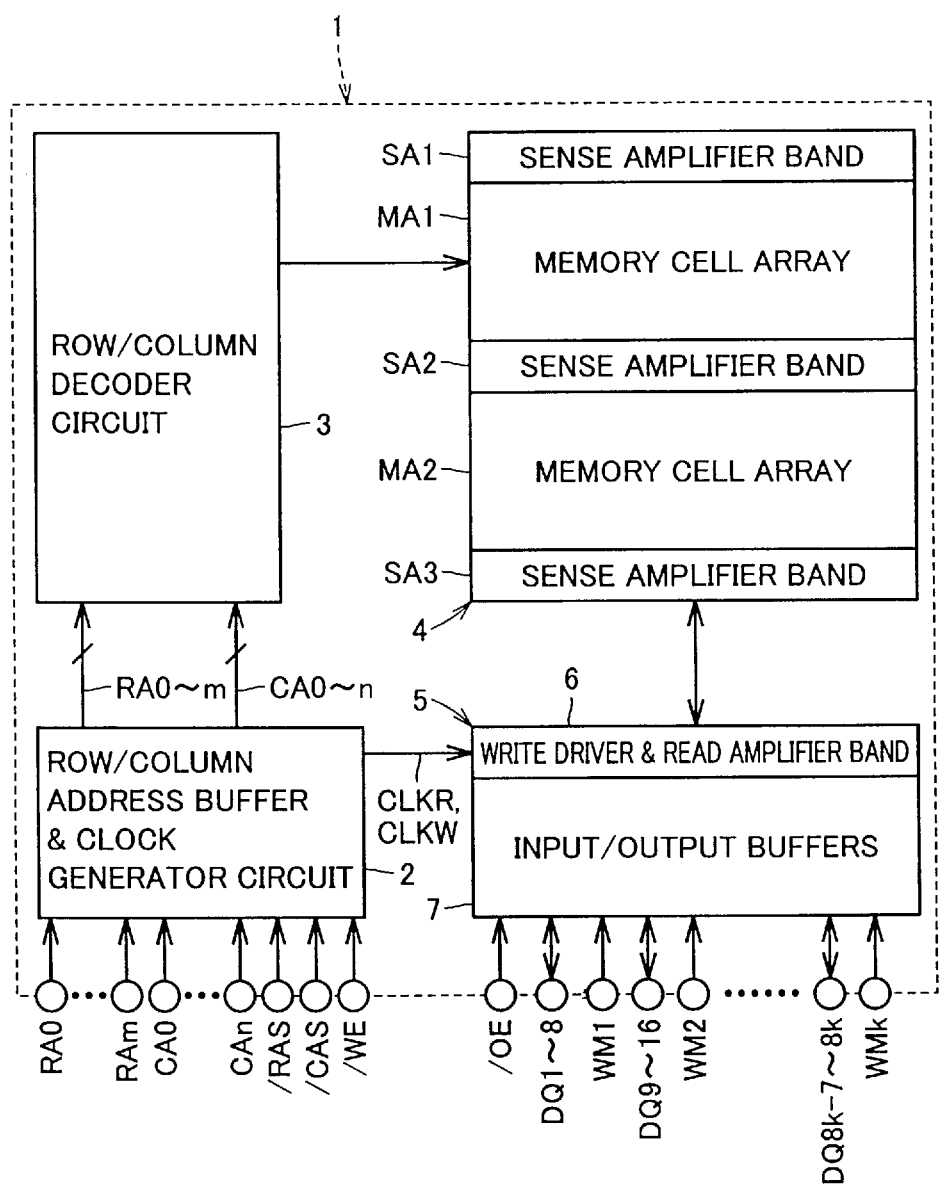
FIG. 1 is a block diagram showing an entire structure of a DRAM according to a first embodiment of the present invention.

FIG. 1 is a block diagram showing an entire structure of a DRAM 1 according to a first embodiment of the present invention. Referring to FIG. 1, DRAM 1 includes a row/column address buffer and clock generator circuit 2, a row/column decoder circuit 3, a memory mat 4 and a data input/output circuit 5. For this DRAM 1, simultaneous input/output of 8k (k is an integer of at least 1) data signals DQ1–DQ8k is possible. For eight data signals, one input terminal for write mask signal WM is provided.

Row/column address buffer and clock generator circuit 2 provides externally supplied row address signals RA0–RAm (m is an integer of at least 0) and column address signals CA0–CAn (n is an integer of at least 0) to row/column decoder circuit 3, and further generates read clock signal CLKR and write clock signal CLKW for example according to external control signals /RAS, /CAS and /WE to control the whole of DRAM 1.

Memory mat 4 includes a plurality of (three in FIG. 1) sense amplifier bands SA1–SA3 and memory cell arrays MA1 and MA2 provided therebetween. Memory cell arrays MA1 and MA2 include a plurality of memory cells each storing one data signal. These memory cells are divided into groups each containing a predetermined number (8k) of cells. Each memory cell group is located at a predetermined address determined by row and column addresses.

According to row address signals RA0–RAm and column address signals CA0–CAn supplied from row/column address buffer and clock generator circuit 2, row/column decoder circuit 3 designates any address in memory cell arrays MA1 and MA2. Sense amplifier bands SA1 and SA2 have sense amplifier and input/output control circuits discussed below. The sense amplifier and input/output control circuits couple 8k memory cells addressed by row/column decoder circuit 3 to data input/output circuit 5. Data input/output circuit 5 includes a write driver and read amplifier band 6 as well as input/output buffers 7. Write driver and read amplifier band 6 includes write drivers and read amplifiers.

Read amplifiers operate synchronously with read clock signal CLKR to provide read data signals Q1–Q8k from selected 8k memory cells to input/output buffers 7. Input/output buffers 7 output, in response to external control signal /OE, read data signals Q1–Q8k from the read amplifiers to external circuitry. Write drivers operate synchronously with write clock signal CLKW to write externally supplied write data signals D1–D8k into selected 8k memory cells. However, 8k memory cells include memory cells designated by write mask signals WM1–WMk and these designated memory cells have no data written thereto.

Figure 2:
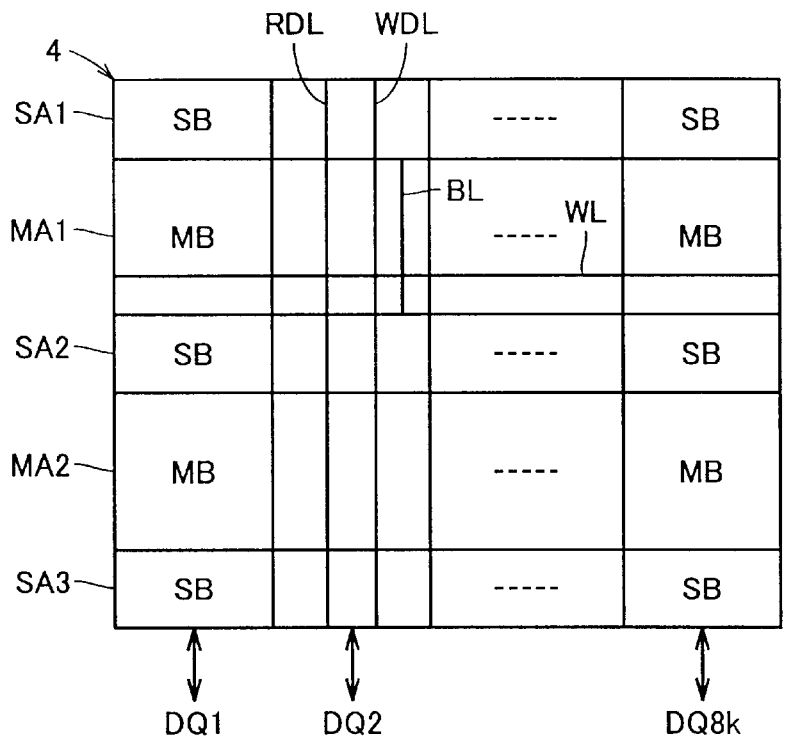
FIG. 2 is a block diagram showing a configuration of a memory mat shown in FIG. 1.

FIG. 2 is a block diagram showing a configuration of memory mat 4 shown in FIG. 1. Referring to FIG. 2, memory cell arrays MA1 and MA2 are each divided into 8k memory blocks MB corresponding respectively to data signals DQ1–DQ8k. Sense amplifier bands SA1–SA3 are each divided into 8k sense blocks SB corresponding respectively to data signals DQ1–DQ8k.

Memory mat 4 includes 8k pairs of read data lines RDL and /RDL for reading respective data signals Q1–Q8k as well as 8k pairs of write data lines WDL and /WDL for writing respective data signals D1–D8k. Paired read data lines RDL and /RDL and paired write data lines WDL and /WDL are placed to cross corresponding three sense blocks SB and two memory blocks MB. One end of these lines each is connected to write driver and read amplifier band 6.

Figure 3:
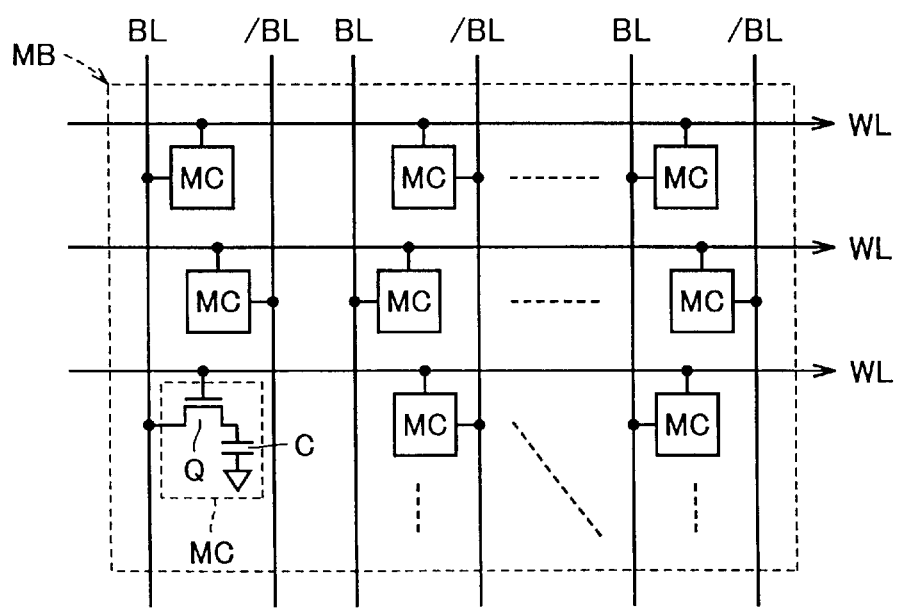
FIG. 3 is a circuit block diagram showing a configuration of a memory block shown in FIG. 2.

Referring to FIG. 3, a memory block MB includes a plurality of memory cells MC arranged in rows and columns, a plurality of word lines WL provided correspondingly to respective rows, and a plurality of pairs of bit lines BL and /BL provided correspondingly to respective columns. Memory cell MC is a memory cell of the known type including an N-channel MOS transistor Q for access and a capacitor C for storing information.

Word line WL is driven to the selection level, H level, to activate each memory cell MC of the row corresponding to that word line WL and accordingly allow data to be written/read into/from each memory cell MC. In order to write data, one word line WL is driven to the selection level of H level to activate memory cell MC and then one of bit lines BL and /BL of one bit line pair is set to H level while the other of the bit lines is set to L level according to a corresponding write data signal (e.g. D1). The bit line potential is thus written into any desired memory cell MC.

In order to read data, the potential on paired bit lines BL and /BL is equalized to bit line precharge potential VBL (=VCC/2), and one word line WL is set to the selection level of H level to activate memory cell MC. Thus, a minute potential difference is generated between bit lines BL and /BL of each pair, according to data stored in memory cell MC. This minute potential difference between paired bit lines BL and /BL is amplified to power supply potential VCC and then the potential difference between paired bit lines BL and /BL is sensed to read a data signal in the desired memory cell MC.

Figure 4:
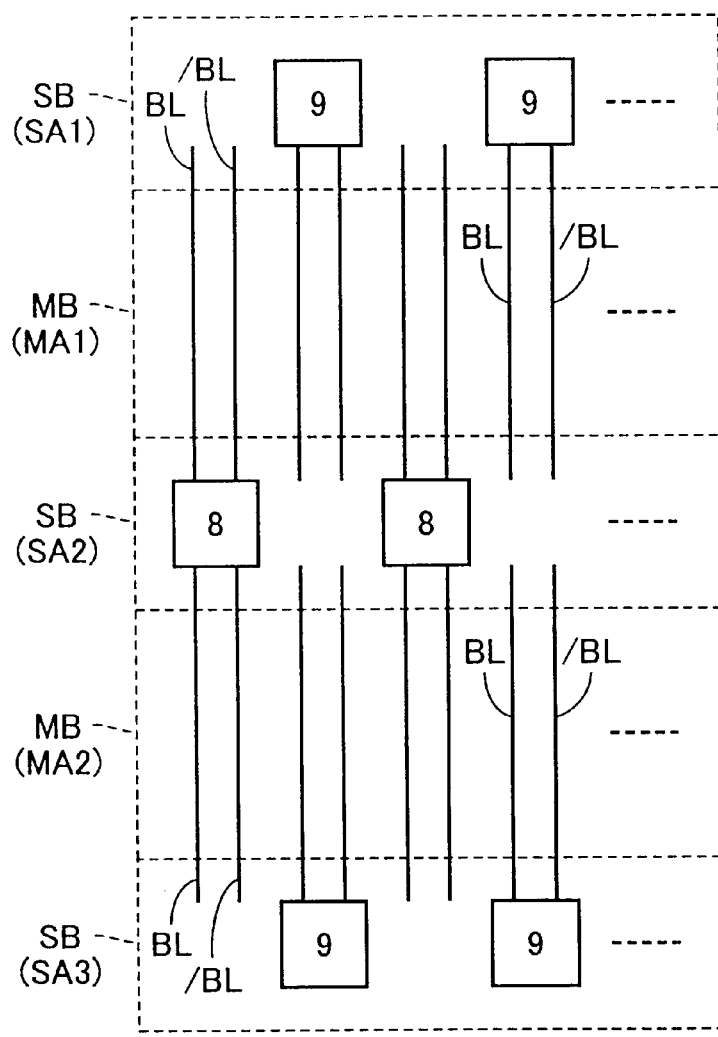
FIG. 4 is a circuit block diagram showing a configuration of a sense block in FIG. 2.

Referring to FIG. 4, a sense block SB of sense amplifier band SA2 includes a sense amplifier and input/output control circuits 8 which is provided correspondingly to each odd-numbered pair of bit lines BL and /BL common to the two memory blocks MB and MB. Respective sense blocks SB of sense amplifier bands SA1 and SA3 each includes a sense amplifier and input/output control circuit 9 provided correspondingly to each even-numbered pair of bit lines BL and /BL of adjacent memory blocks MB.

Figure 5:
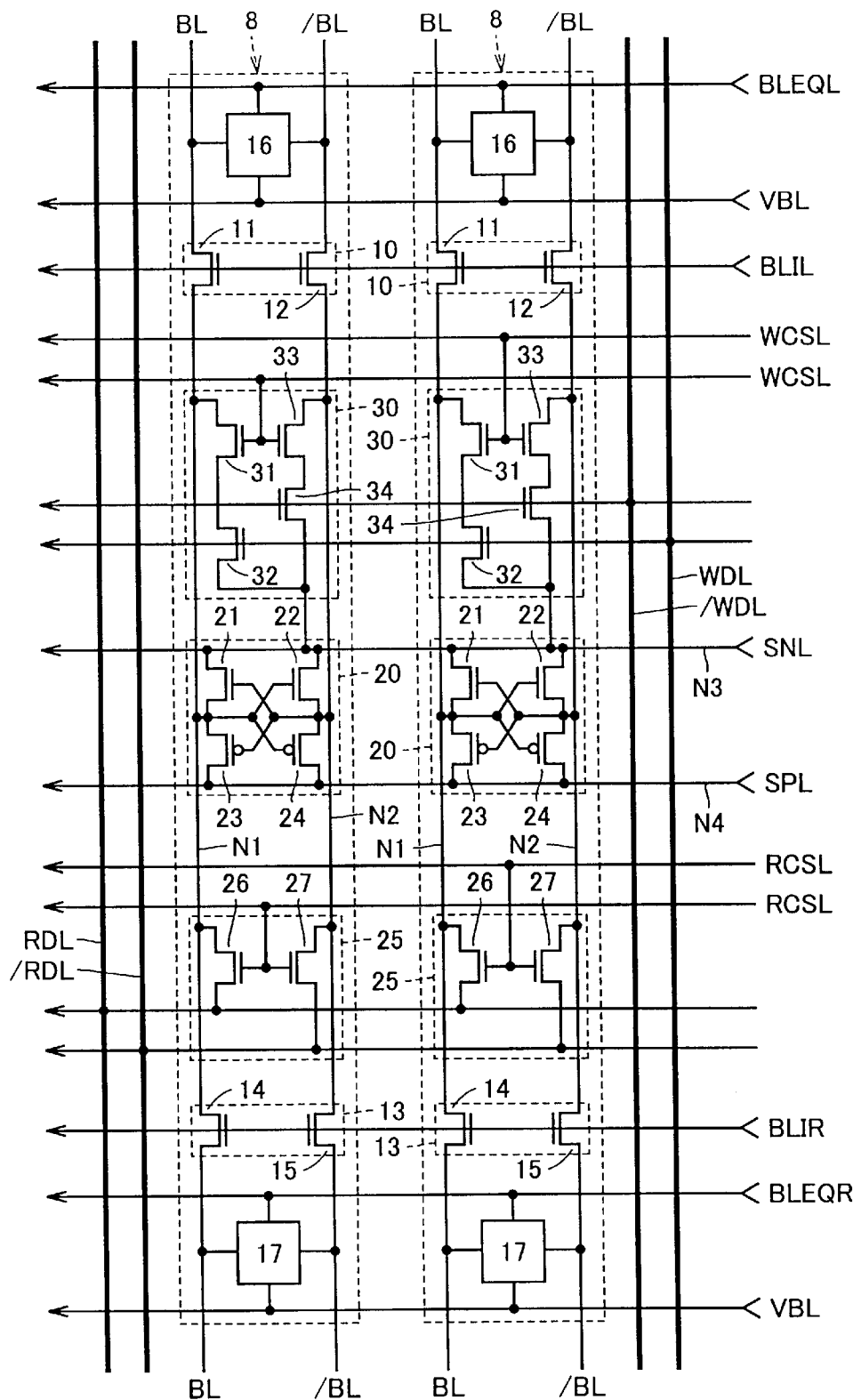
FIG. 5 is a circuit block diagram showing a configuration of a sense amplifier and input/output control circuit 8 shown in FIG. 4.

Referring to FIG. 5, sense amplifier and input/output control circuit 8 includes transfer gates 10 and 13, equalizers 16 and 17, a sense amplifier 20, a read column select gate 25, and a write column select gate 30. Transfer gate 10 includes a pair of N-channel MOS transistors 11 and 12 connected respectively between nodes N1 and N2 and corresponding paired bit lines BL and /BL of memory block MB in memory cell array MA1, the MOS transistors having respective gates both receiving signal BLIL. Transfer gate 13 includes a pair of N-channel MOS transistors 14 and 15 connected respectively between nodes N1 and N2 and corresponding paired bit lines BL and /BL of memory block MB of memory cell array MA2, the MOS transistors having respective gates both receiving signal BLIR.

When row/column decoder circuit 3 sets, to L level, one of signals BLIL and BLIR, that is signal BLIL, those two N-channel MOS transistors 11 and 12 of transfer gate 10 are turned off to disconnect paired bit lines BL and /BL of memory cell array MA1 from nodes N1 and N2. When row/column decoder circuit 3 sets, to L level, one of signals BLIL and BLIR, that is signal BLIR, those two N-channel MOS transistors 14 and 15 of transfer gate 13 are turned off to disconnect paired bit lines BL and /BL in memory cell array MA2 from nodes N1 and N2.

Equalizer 16 is connected to paired bit lines BL and /BL in memory cell array MA1. When bit line equalize signal BLEQL is set to the activation level, L level, equalizer 16 equalizes the corresponding paired bit lines BL and /BL to bit line precharge potential VBL (=VCC/2).

Figure 6:
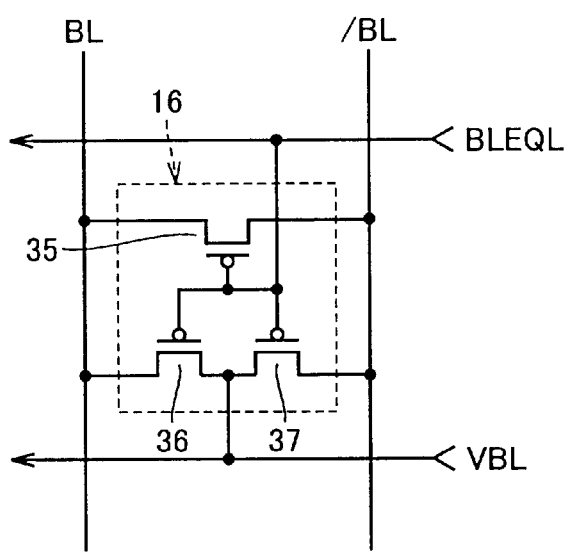
FIG. 6 is a circuit diagram showing a configuration of an equalizer shown in FIG. 5.

Specifically, referring to FIG. 6, equalizer 16 includes P-channel MOS transistors 35–37. P-channel MOS transistor 35 is connected between paired bit lines BL and /BL, and P-channel MOS transistors 36 and 37 are connected in series between paired bit lines BL and /BL. P-channel MOS transistors 35–37 have respective gates receiving bit line equalize signal BLEQL. There is a node between P-channel MOS transistors 36 and 37 that receives bit line precharge potential VBL.

When row/column decoder circuit 3 sets bit line equalize signal BLEQL to the activation level, L level, P-channel MOS transistors 35–37 are turned on to equalize bit lines BL and /BL both to bit line precharge potential VBL. When row/column decoder circuit 3 sets bit line equalize signal BLEQL to the inactivation revel, H level, P-channel MOS transistors 35–37 are turned off to stop equalizing of bit lines BL and /BL Referring back to FIG. 5, equalizer 17 is connected to paired bit lines BL and /BL in memory cell array MA2. When bit line equalize signal BLEQR is set to the activation level, L level, equalizer 17 equalizes corresponding paired bit lines BL and /BL to bit line precharge potential VBL. Equalizer 17 is structured similarly to equalizer 16.

Sense amplifier 20 is activated when sense amplifier activation signals SNL and SPL are set respectively to L and H levels to amplify a minute potential difference between nodes N1 and N2 to power supply potential VCC. Specifically, sense amplifier 20 includes N-channel MOS transistors 21 and 22 and P-channel MOS transistors 23 and 24. N-channel MOS transistors 21 and 22 are connected respectively between nodes N1 and N2 and a node N3, and have respective gates connected to nodes N2 and N1. P-channel MOS transistors 23 and 24 are connected respectively between nodes N1 and N2 and a node N4, and have respective gates connected to nodes N2 and N1. Nodes N3 and N4 receive respective sense amplifier activation signals SNL and SPL. Sense amplifier activation signals SNL and SPL are generated by row/column decoder circuit 3, both set to the intermediate level (VCC/2) in a standby mode and set respectively at L level and H level in an active mode.

In the standby mode, nodes N1–N4 are all set to the intermediate level VCC/2 to cause all MOS transistors 21–24 to be turned off. In the active mode, a minute potential difference between paired bit lines BL and /BL is transmitted to nodes N1 and N2 while nodes N3 and N4 are set respectively to L level and H level.

If the potential on node N1 is higher than the potential on node N2, MOS transistors 22 and 23 have a resistance value lower than that of MOS transistors 21 and 24. Then, the potential on node N1 is raised to power supply potential VCC while the potential on node N2 is lowered to ground potential GND. If the potential on node N2 is higher than that on node N1, MOS transistors 21 and 24 have a resistance value lower than that of MOS transistors 22 and 23. Then, the potential on node N2 is raised to power supply potential VCC while the potential on node N1 is lowered to ground potential GND.

Read select gate 25 includes N-channel MOS transistors 26 and 27. N-channel MOS transistors 26 and 27 are connected respectively between nodes N1 and N2 and read data lines RDL and /RDL and have respective gates connected to read column select line RCSL of a corresponding column. Read column select line RCSL is provided correspondingly to each sense amplifier and input/output control circuit 8 and commonly to $8k$ sense blocks SB in sense amplifier band SA2. When row/column decoder circuit 3 sets read column select line RCSL according to column address signals CA0–CAn to the selection level, H level, N-channel MOS transistors 26 and 27 of read column select gate 25 of that column are turned on, and accordingly the potentials on nodes N1 and N2 are transmitted through N-channel MOS transistors 26 and 27 to read data lines RDL and /RDL.

Write column select gate 30 includes N-channel MOS transistors 31–34. N-channel MOS transistors 31 and 32 are connected in series between nodes N1 and N3 and N-channel MOS transistors 33 and 34 are connected in series between nodes N2 and N3. N-channel MOS transistors 31 and 33 have respective gates both connected to write column select line WCSL of a corresponding column. N-channel MOS transistors 34 and 32 have respective gates connected respectively to write data lines WDL and /WDL. Write column select line WCSL is provided correspondingly to each sense amplifier and input/output control circuit 8 and commonly to $8k$ sense blocks SB in sense amplifier band SA2.

When row/column decoder circuit 3 sets write column select line WCSL according to column address signals CA0–CAn to the selection level, H level, N-channel MOS transistors 31 and 33 of write column select gate 30 of that column are turned on. If write data lines WDL and /WDL have H and L levels respectively, one of N-channel MOS transistors 32 and 34, that is N-channel MOS transistors 34, is turned on. Accordingly, node N2 is set to L level and node N1 is set to H level by sense amplifier 20. If write data lines WDL and /WDL have L land H levels respectively, one of N-channel MOS transistors 32 and 34, that is N-channel MOS transistor 32, is turned on. Accordingly, node N1 is set to L level and node N2 is set to H level by sense amplifier 20.

Sense amplifier and input/output control circuit 9 in sense amplifier band SA1 differs from sense amplifier and input/output control circuit 8 in sense amplifier band SA2 in that the circuit 9 does not include transfer gates 10 and 13 and equalizer 17 for memory cell array MA2. Sense amplifier and input/output control circuit 9 in sense amplifier band SA3 differs from sense amplifier and input/output control circuit 8 in sense amplifier band SA2 in that the circuit 9 does not include transfer gates 10 and 13 and equalizer 16 for memory cell array MA1. Column select lines RCSL and WCSL are provided separately to sense amplifier band SA1 and sense amplifier band SA3.

Figure 7:
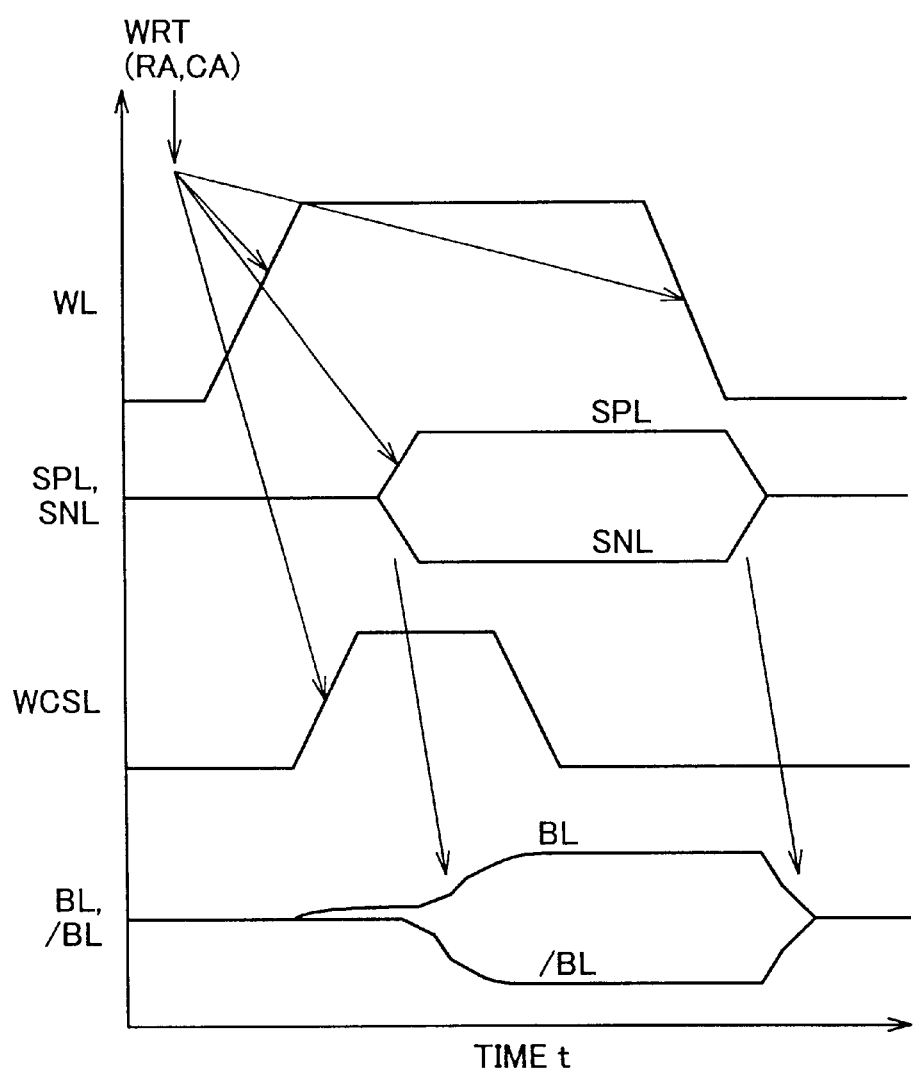
FIG. 7 is a timing chart illustrating a write operation of the DRAM shown in FIGS. 1–6.

FIG. 7 is a timing chart illustrating a write operation of this DRAM. In a standby state, word line WL has the non-selection level, L level, and accordingly memory cell MC is inactivated. Further, write column select line WCSL has the non-selection level, L level, and accordingly N-channel MOS transistors 31 and 33 of write column select gate 30 are turned off. Equalizers 16 and 17 are activated to precharge paired bit lines BL and /BL to bit line precharge potential VCC/2. Sense amplifier activation signals SPL and SNL have the intermediate level VCC/2 to inactivate sense amplifier 20. Signals BLIL and BLIR have H level to render transfer gates 10 and 13 nonconductive, and read column select line RCSL has the non-selection level, L level, and accordingly read column select gate 25 is rendered nonconductive.

At a certain time, write command WRT, row address signals RA0–RAm and column address signals CA0–CAn are simultaneously provided. Here, it is supposed that memory cell array MA1 is selected according to row address signals RA0–RAm. Then, signal BLIR is set to L level to render transfer gate 13 nonconductive so that sense amplifier 20 is disconnected from memory cell array MA2. Further, equalizer 16 is inactivated and word line WL according to row address signals RA0–RAm is raised to the selection level, H level. In this way, each memory cell MC for that word line WL is activated to cause a minute potential difference between paired bit lines BL and /BL, the difference being of a polarity corresponding to stored data in that memory cell MC.

Then, write column select line WCSL of a column according to column address signals CA0–CAn is raised to the selection level, H level, and N-channel MOS transistors 31 and 33 of write column select gate 30 for that column are turned on. According to a write data signal, write data lines WDL and /WDL are set in advance to H and L levels respectively for example. Accordingly, bit line BL or bit line /BL of the selected column is lowered to L level.

Following this, sense amplifier activation signals SPL and SNL are set respectively to H and L levels to activate sense amplifier 20, which amplifies the potential difference between paired bit lines BL and /BL to power supply potential VCC. In this way, respective levels of bit lines BL and /BL of the selected column are changed into respective levels of write data lines WDL and /WDL. Bit lines BL and /BL of a non-selected column have their levels maintained. After a predetermined time, write column select line WCSL is lowered to the non-selection level, L level.

Finally, word line WL is lowered to the non-selection level of L level. Memory cell MC is thus inactivated, sense amplifier activation signals SPL and SNL are set to the intermediate level VCC/2 to inactivate sense amplifier 20. Equalizer 16 is activated to precharge bit lines BL and /BL to precharge potential VBL. Signal BLIR is set to H level and transfer gate 13 is made conductive. This process thus returns to the standby state.

For a reading operation, read command READ is provided instead of write command WRT, and read column select line RCSL is selected instead of write column select line WCSL. A potential difference between paired bit lines BL and /BL of a selected column is amplified by sense amplifier 20, and this amplified potential difference is supplied through read column select gate 25 to paired read data lines RDL and /RDL. A read amplifier compares respective potentials on read data lines RDL and /RDL to output a data signal of a logic level according to that comparison through an input/output buffer to any external circuitry. Except for the details above, the reading operation is similar to the write operation.

Figure 8:
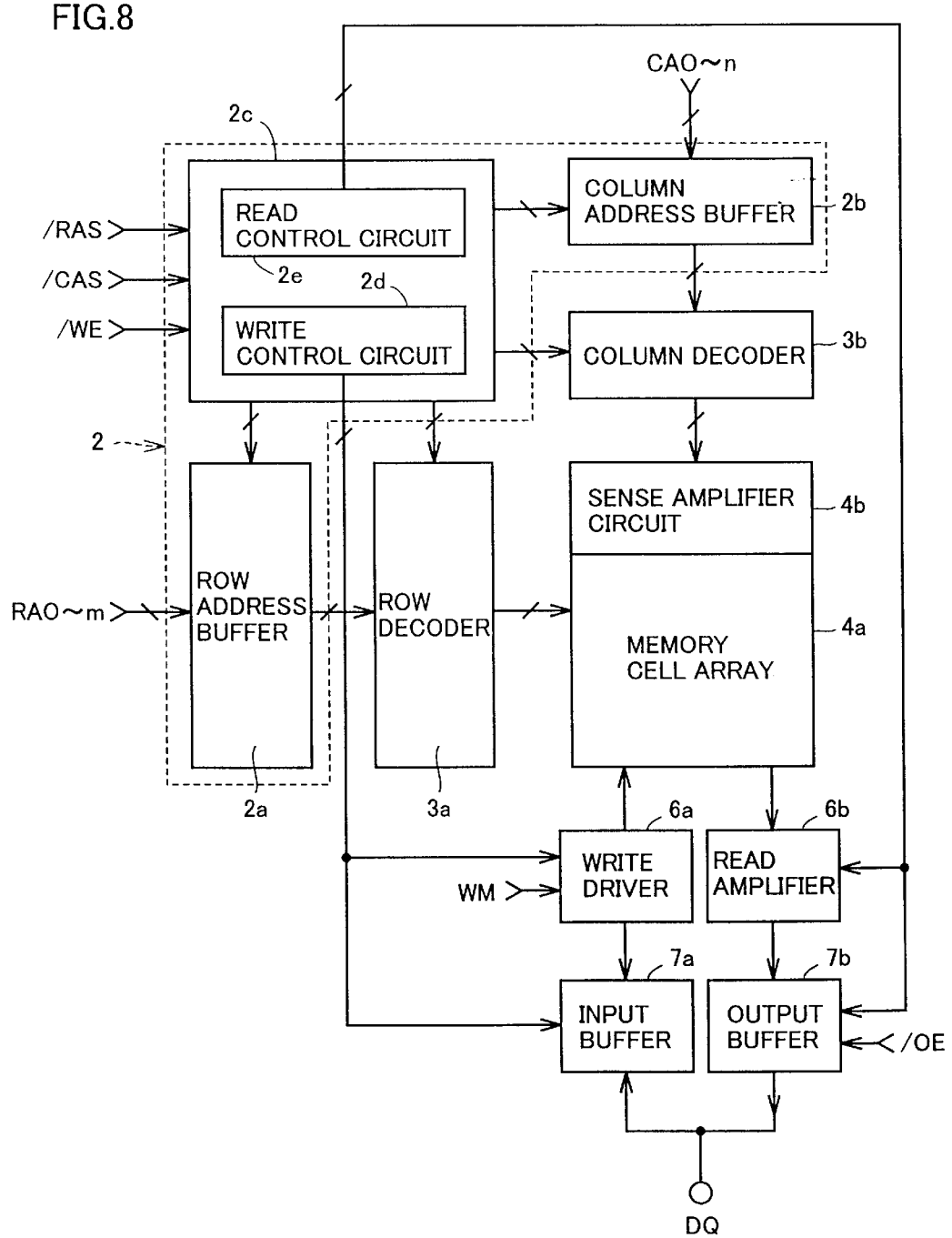
FIG. 8 is a block diagram for supplemental description of the DRAM shown in FIG. 1.

The following is a supplemental description of DRAM 1 with respect to its configuration and operation. FIG. 8 is a block diagram showing in more detail DRAM 1 in FIG. 1. Referring to FIG. 8, row/column address buffer and clock generator circuit 2 shown in FIG. 1 includes a row address buffer 2a, a column address buffer 2b and a clock generator circuit 2c, and clock generator circuit 2c includes a write control circuit 2d and a read control circuit 2e. Row/column decoder circuit 3 includes a row decoder 3a and a column decoder 3b. Memory mat 4 includes a memory cell array 4a and a sense amplifier circuit 4b. Write driver and read amplifier band 6 includes a write driver 6a and a read amplifier 6b. Input/output buffers 7 include an input buffer 7a and an output buffer 7b.

Row address buffer 2a provides externally supplied row address signals RA0–RAm to row decoder 3a. According to row address signals RA0–RAm from row address buffer 2a, row decoder 3a selects one of a plurality of word lines WL in memory cell array 4a to drive the selected word line WL to the selection level of H level.

Column address buffer 2b provides externally supplied column address signals CA0–CAn to column decoder 3b. In write operation, column decoder 3b selects one of a plurality of write column select lines WCSL according to column address signals CA0–CAn from column address buffer 2b to drive the selected write column select line WCSL to the selection level of H level. In read operation, column decoder 3b selects one of a plurality of read column select lines RCSL according to column address signals CA0–CAn from column address buffer 2b to drive the selected read column select line RCSL to the selection level of H level.

In write operation, input buffer 7a provides externally supplied write data signal D to write driver 6a. When write mask signal WM has L level, write driver 6a drives one of write data lines WDL and /WDL (e.g. WDL) to H level while driving the other write data line (/WDL) to L level according to write data signal D from input buffer 7a. When write mask signal WM has H level, write driver 6a drives both of write data lines WDL and /WDL to L level.

In read operation, read amplifier 6b compares respective potentials on read data lines RDL and /RDL to generate read data signal Q according to the result of comparison. Output buffer 7b outputs read data signal Q generated by read amplifier 6b in response to activation of output enable signal /OE to L level.

When write command WRT is supplied by external control signals /RAS, /CAS and /WE, write control circuit 2d controls, as shown in FIG. 7, respective predetermined timings of row address buffer 2a, row decoder 3a, column address buffer 2b, column decoder 3b, write driver 6a and input buffer 7a to write write data signal D into a selected memory cell MC.

When read command READ is supplied by external control signals /RAS, /CAS and /WE, read control circuit 2e controls respective predetermined timings of row address buffer 2a, row decoder 3a, column address buffer 2b, column decoder 3b, read amplifier 6b and output buffer 7b to read data signal Q from a selected memory cell MC.

According to the first embodiment, respective sources of N-channel MOS transistors 32 and 34 of write column select gate 30 are connected to node N3. Then, even if write column select line WCSL and paired write data lines WDL and /WDL are driven before sense amplifier 20 is driven, sense amplifier 20 never malfunctions prematurely until sense amplifier activation signals SNL and SPL are set respectively to L and H levels. Data is read from memory cell MC and sense amplifier 20 starts sensing and amplifying for that data while sense amplifier 20 latches an external data signal. Thus, as shown in FIG. 7, write column select line WCSL and paired write data lines WDL and /WDL are driven prior to activation of sense amplifier 20, which makes it possible to write the external data signal into sense amplifier 20 simultaneously with sensing and amplification of the memory cell data and thus makes it possible to enhance the frequency of random access.

In addition, execution of the write operation requires only the write command WRT. The command can thus be issued in a simplified manner compared with the conventional command operation which requires three commands, i.e., active command ACT, write command WRT and precharge command PRE.

Figure 10:
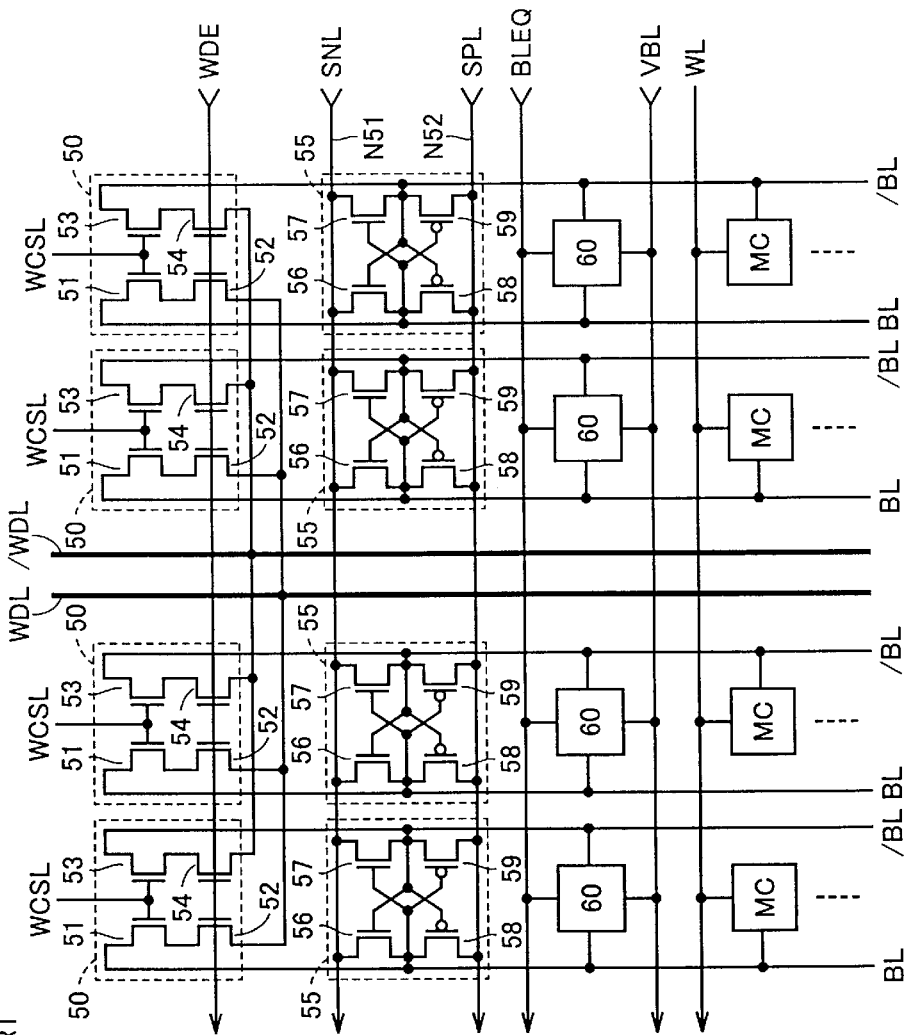
FIG. 10 is a circuit block diagram showing a principal portion of a conventional DRAM.
Figure 11:
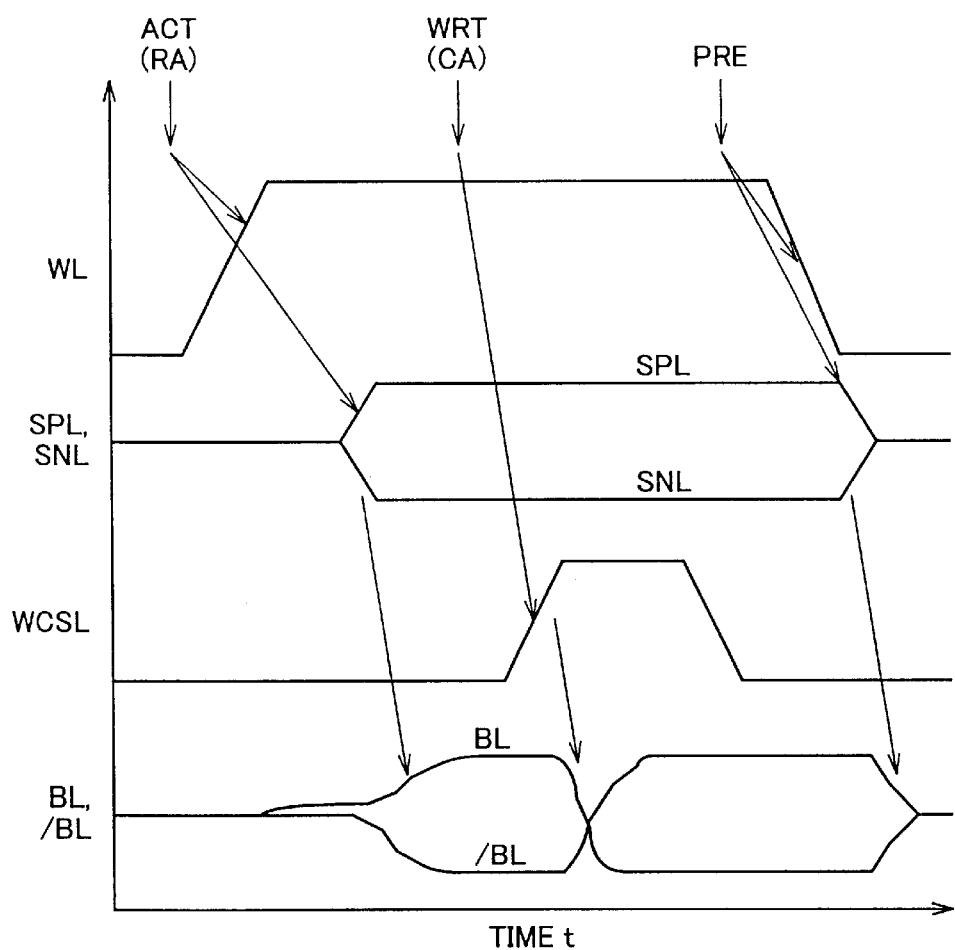
FIG. 11 is a timing chart illustrating a write operation of the DRAM shown in FIG. 10.

Here, with reference to the DRAM shown in FIG. 10, suppose that sense amplifier activation signals SNL and SPL are charged to the intermediate level VCC/2, write column select line WCSL of a selected column is set to H level, and write data lines WDL and /WDL are set respectively to H and L levels. Then, bit lines BL and /BL of the selected column have H and L levels respectively. Accordingly, MOS transistors 57 and 58 of sense amplifier 55 of the selected column are turned on to set nodes N51 and N52 to L and H levels respectively. As a result, sense amplifier 55 starts its sensing operation before a minute potential difference is read appropriately from memory cell MC onto paired bit lines BL and /BL, which hinders normal sensing and amplifying operation.

Memory cell data might normally be read by providing nodes N51 and N52 separately for each sense amplifier 55 to prevent any sense amplifier 55 of a non-selected column from operating. Actually, however, paired bit lines BL and /BL of a selected column are coupled with paired bit lines BL and /BL of an adjacent column to cause noise on the adjacent pair of bit lines BL and /BL. Then, the normal sensing and amplifying operation is impossible here.

Figure 12:
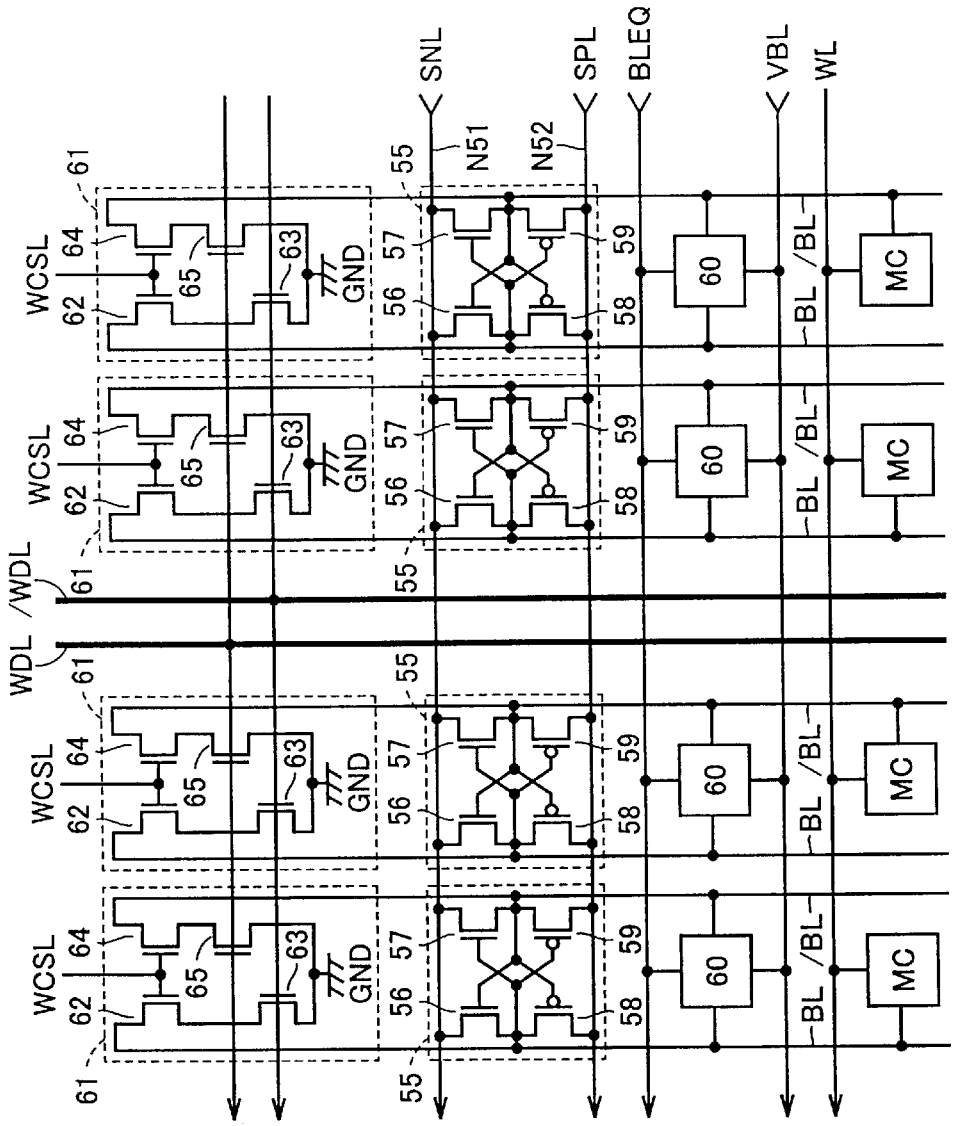
FIG. 12 is a circuit block diagram showing a principal portion of another conventional DRAM.

In addition, with reference to the DRAM shown in FIG. 12, suppose that sense amplifier activation signals SNL and SPL are charged to the intermediate level VCC/2, write column select line WCSL of a selected column is set to H level, and write data lines WDL and /WDL are set respectively to H and L levels. Then, bit line BL or bit line /BL of the selected column has L level. Accordingly, N-channel MOS transistor 57 of the selected column is turned on to set node N51 to L level. As a result, sense amplifier 55 starts its sensing operation before a minute potential difference is normally read from memory cell MC onto paired bit lines BL and /BL, which also hinders normal sensing and amplifying operation.

Second Embodiment

Figure 9:
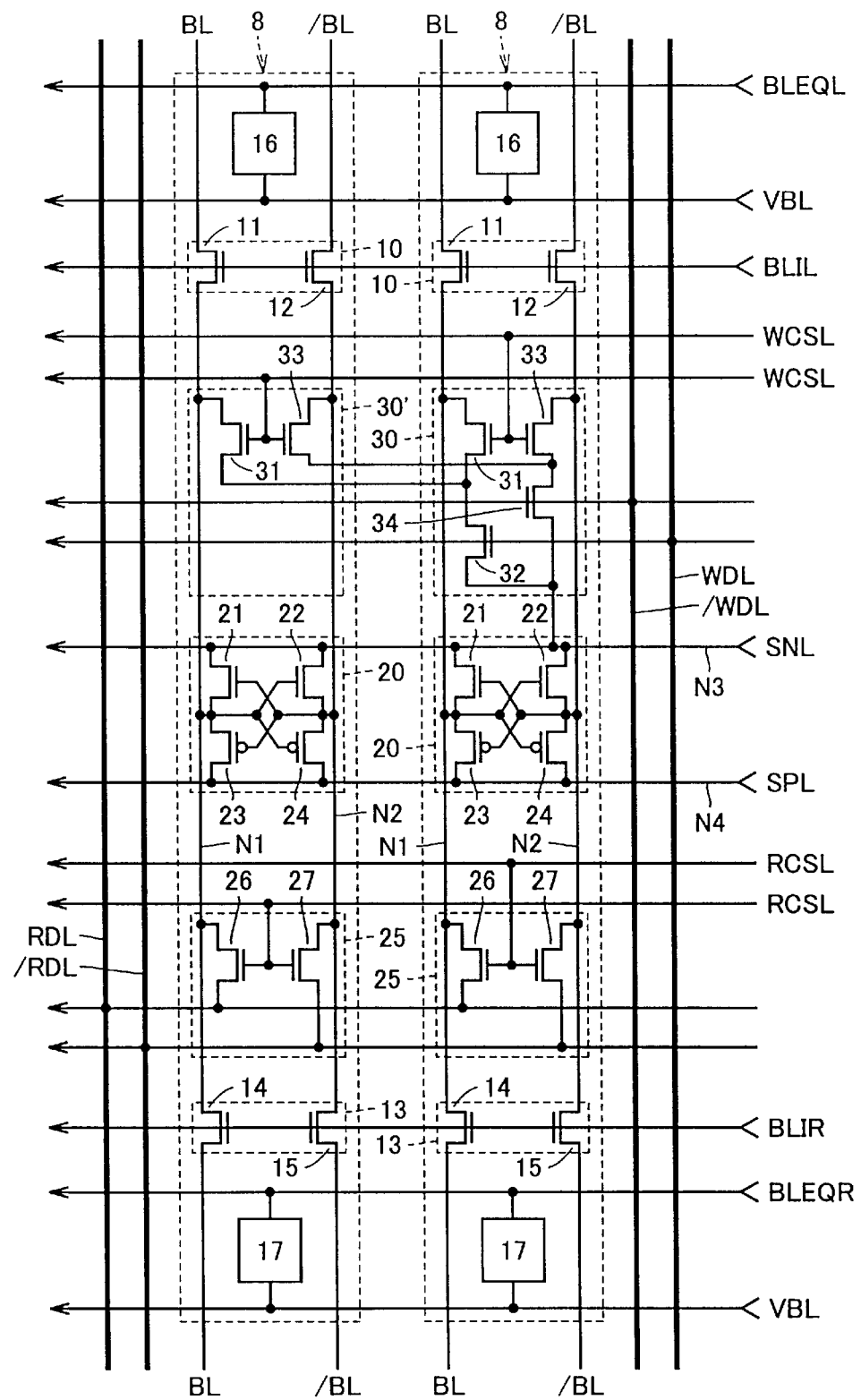
FIG. 9 is a circuit block diagram showing a principal portion of a DRAM according to a second embodiment of the present invention.

FIG. 9 is a circuit block diagram showing a principal portion of a DRAM according to a second embodiment of the present invention. As FIG. 9 is compared with FIG. 5, it is found that the DRAM in FIG. 9 differs from the DRAM in FIG. 5 in that the former DRAM includes a write column select gate(s) 30' instead of write column select gate(s) 30 except for one write column select gate 30 among a plurality of (two in FIG. 5) write column select gates 30.

Write column select gate 30' lacks N-channel MOS transistors 32 and 34 of write column select gate 30. Write column select gate 30' includes N-channel MOS transistors 31 and 33 having respective sources connected to respective sources of N-channel MOS transistors 31 and 33 of write column select gate 30. The structure and operation of the second embodiment except for the details discussed above are the same as those of the first embodiment and description thereof is not repeated here.

According to the second embodiment, paired write data lines WDL and /WDL have reduced capacity, which makes it possible to speed up the write operation and reduce the power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device allowing a data signal to be rewritten thereinto, comprising:
   a memory block including a plurality of memory cells arranged in rows and columns, a plurality of word lines provided correspondingly to said rows respectively, and a plurality of pairs of bit lines provided correspondingly to said columns respectively;
   a sense amplifier provided correspondingly to each pair of bit lines and activated in response to application of a first drive potential to a first node to amplify a potential difference generated between the bit lines of the corresponding bit line pair;
   a row decoder selecting one of said plurality of word lines according to a row address signal to activate each memory cell corresponding to the selected word line;
   a column decoder selecting one of said plurality of pairs of bit lines according to a column address signal;
   a pair of write data lines provided commonly to said plurality of pairs of bit lines;
   a write circuit, according to a write data signal, setting one of first and second write data lines included in said pair of write data lines to a first potential and setting the other of said first and second write data lines to a second potential; and
   a write column select gate transmitting, in write operation, the data signal on said pair of write data lines to the pair of bit lines selected by said column decoder,
   said write column select gate including
   first and second transistors provided for each pair of bit lines, having respective gate electrodes connected to said first and second write data lines respectively and having respective first electrodes both connected to said first node, and
   third and fourth transistors provided for each pair of bit lines, having respective first electrodes connected to respective second electrodes of said first and second transistors and having respective second electrodes connected respectively to first and second bit lines of the corresponding pair of bit lines, the third and fourth transistors being rendered conductive, in the write operation, in response to selection of the corresponding pair of bit lines by said column decoder.

2. The semiconductor memory device according to claim 1, further comprising a write control circuit activating, in response to a write command signal, said row decoder, said column decoder and said write circuit and thereafter applying said first drive potential to said first node to activate said sense amplifier.

3. The semiconductor memory device according to claim 2, further comprising a precharge circuit provided correspondingly to each pair of bit lines for precharging the corresponding pair of bit lines to a predetermined potential, wherein
   said write control circuit inactivates, after the write operation is completed, said row decoder, said column decoder, said write circuit and said sense amplifier, and activates said precharge circuit.

4. The semiconductor memory device according to claim 3, further comprising a read control circuit applying, in response to a read command signal in read operation, said first drive potential to said first node to activate said sense amplifier,
   said read control circuit inactivates, after the read operation is completed, said row decoder, said column decoder and said sense amplifier.

5. The semiconductor memory device according to claim 1, wherein
   said sense amplifier includes
   fifth and sixth transistors of N-channel type, connected respectively between said first and second bit lines and said first node, and having respective gate electrodes connected respectively to said second and first bit lines, and seventh and eighth transistors of P-channel type connected respectively between said first and second bit lines and a second node and having respective gate electrodes connected respectively to said second and first bit lines, wherein said sense amplifier is activated in response to application of said first drive potential to said first node and application of a second drive potential to said second node.

6. A semiconductor memory device allowing a data signal to be rewritten thereinto, comprising:

a memory block including a plurality of memory cells arranged in rows and columns, a plurality of word lines provided correspondingly to said rows respectively, and a plurality of pairs of bit lines provided correspondingly to said columns respectively;

a sense amplifier provided correspondingly to each pair of bit lines and activated in response to application of a first drive potential to a first node to amplify a potential difference generated between the bit lines of the corresponding bit line pair;

a row decoder selecting one of said plurality of word lines according to a row address signal to activate each memory cell corresponding to the selected word line;

a column decoder selecting one of said plurality of pairs of bit lines according to a column address signal;

a pair of write data lines provided commonly to said plurality of pairs of bit lines;

a write circuit, according to a write data signal, setting one of first and second write data lines included in said pair of write data lines to a first potential and setting the other of said first and second write data lines to a second potential; and a write column select gate transmitting, in write operation, the data signal on said pair of write data lines to the pair of bit lines selected by said column decoder, said write column select gate including first and second transistors provided in common to each of said plurality of pairs of bit lines, having respective gate electrodes connected to said first and second write data lines respectively and having respective first electrodes both connected to said first node, and third and fourth transistors provided for each pair of bit lines, having respective first electrodes connected to respective second electrodes of said first and second transistors and having respective second electrodes connected respectively to first and second bit lines of the corresponding pair of bit lines, the third and fourth transistors being rendered conductive, in the write operation, in response to selection of the corresponding pair of bit lines by said column decoder.

7. The semiconductor memory device according to claim 6, further comprising a write control circuit activating, in response to a write command signal, said row decoder, said column decoder and said write circuit and thereafter applying said first drive potential to said first node to activate said sense amplifier.

8. The semiconductor memory device according to claim 7, further comprising a precharge circuit provided correspondingly to each pair of bit lines for precharging the corresponding pair of bit lines to a predetermined potential, wherein said write control circuit inactivates, after the write operation is completed, said row decoder, said column decoder, said write circuit and said sense amplifier, and activates said precharge circuit.

9. The semiconductor memory device according to claim 8, further comprising a read control circuit applying, in response to a read command signal in read operation, said first drive potential to said first node to activate said sense amplifier, said read control circuit inactivates, after the read operation is completed, said row decoder, said column decoder and said sense amplifier.

10. The semiconductor memory device according to claim 6, wherein said sense amplifier includes fifth and sixth transistors of N-channel type, connected respectively between said first and second bit lines and said first node, and having respective gate electrodes connected respectively to said second and first bit lines, and seventh and eighth transistors of P-channel type connected respectively between said first and second bit lines and a second node and having respective gate electrodes connected respectively to said second and first bit lines, wherein said sense amplifier is activated in response to application of said first drive potential to said first node and application of a second drive potential to said second node.

* * * * *